US012733462B2

(12) United States Patent
Lillibridge

(10) Patent No.: US 12,733,462 B2
(45) **Date of Patent: *Sep. 8, 2026**

(54) APPARATUS WITH OVERLAPPING DEEP TRENCH AND SHALLOW TRENCH AND METHOD OF FABRICATING THE SAME WITH LOW DEFECT DENSITY

(71) Applicant: TEXAS INSTRUMENTS INCORPORATED, Dallas, TX (US)

(72) Inventor: Thomas Edward Lillibridge, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 305 days.

This patent is subject to a terminal disclaimer.

(21) Appl. No.: 17/110,478

(22) Filed: Dec. 3, 2020

(65) Prior Publication Data

US 2021/0090941 A1 Mar. 25, 2021

Related U.S. Application Data

(63) Continuation of application No. 15/901,449, filed on Feb. 21, 2018, now Pat. No. 10,879,106.

(51) Int. Cl.
*H01L 21/02* (2006.01)
*H10D 62/10* (2025.01)
(Continued)

(52) U.S. Cl.
CPC .......... *H10W 10/17* (2026.01); *H10D 62/115* (2025.01); *H10D 64/117* (2025.01);
(Continued)

(58) Field of Classification Search
None
See application file for complete search history.

(56) References Cited

U.S. PATENT DOCUMENTS 4,579,812 A * 4/1986 Bower .............. H01L 21/76229 430/394
5,895,253 A * 4/1999 Akram .............. H01L 21/76232 257/E21.549
(Continued)

FOREIGN PATENT DOCUMENTS

| | | | |
|---|---|---|---|
| JP | 2004260151 | A | 9/2004 |
| JP | 2006108646 | A | 4/2006 |
| JP | 2011243638 | A | 12/2011 |

OTHER PUBLICATIONS

Search Report for Application No. 19757672.1-1211 / 3756213 PCT/US2019019005, dated Mar. 31, 2021.
(Continued)

*Primary Examiner* — Nathan W Ha
(74) *Attorney, Agent, or Firm* — Andrew R. Ralston; Frank D. Cimino

(57) ABSTRACT

An integrated circuit includes a semiconductor substrate that has a top surface. A trench is formed within the substrate, and a conductive filler structure fills the trench. An insulator is located between the semiconductor substrate and the conductive filler. The insulator has a top portion with a top surface at the top surface of the substrate, The insulator further has a bottom portion that forms a corner with the top portion and extends from the corner to a bottom of the trench.

20 Claims, 10 Drawing Sheets

(51) Int. Cl.
*H10D 64/00* (2025.01)
*H10P 14/60* (2026.01)
*H10P 50/00* (2026.01)
*H10W 10/00* (2026.01)
*H10W 10/17* (2026.01)

(52) U.S. Cl.
CPC ........ *H10P 14/6332* (2026.01); *H10P 50/692* (2026.01); *H10W 10/0143* (2026.01)

(56) References Cited

U.S. PATENT DOCUMENTS 5,972,777 A * 10/1999 Hsu .................. H01L 21/76213 257/E21.258
6,110,797 A * 8/2000 Perry ................ H01L 21/76224 257/E21.549
6,214,696 B1 * 4/2001 Wu .................. H01L 21/76232 257/E21.549
8,703,577 B1 4/2014 Zhu
10,615,071 B2 * 4/2020 Kar-Roy ............... H01L 23/481
10,879,106 B2 * 12/2020 Lillibridge ........ H01L 21/76229
2005/0176214 A1 * 8/2005 Chang ............... H01L 21/76232 257/E21.549
2006/0063349 A1 * 3/2006 Chang ............... H01L 21/76232 257/E21.549
2006/0063389 A1 * 3/2006 Chang .................. H01L 21/763 257/E21.549
2007/0210366 A1 * 9/2007 Sandhu ................. G11C 11/401 257/305
2009/0314963 A1 * 12/2009 Hautala .................. H01J 37/08 250/492.21
2011/0217832 A1 * 9/2011 Raorane ........... H01L 21/76831 257/E21.295
2011/0281416 A1 * 11/2011 Hashimoto ....... H01L 21/76232 257/E21.546
2012/0018840 A1 1/2012 Kang
2013/0052795 A1 * 2/2013 Watanabe ......... H01L 21/76229 257/E21.546
2013/0292791 A1 * 11/2013 Lin ....................... H10D 62/10 257/E29.02
2016/0336184 A1 11/2016 Grivna et al.
2016/0379982 A1 12/2016 You et al.
2017/0213913 A1 7/2017 Lee et al.
2018/0350659 A1 * 12/2018 Adusumilli ....... H01L 21/76235

OTHER PUBLICATIONS

PCT Search Report for Application No. PCT/US 2019/019005, dated May 23, 2019.

* cited by examiner 132
131
114
112
133
128
107
108
127
126
124
129
122
102

220A

222 FORMING A SHALLOW TRENCH OXIDE LAYER FILLING THE SHALLOW TRENCH

224 FORMING A HARD MASK LAYER COVERING THE SHALLOW TRENCH OXIDE LAYER

APPARATUS WITH OVERLAPPING DEEP TRENCH AND SHALLOW TRENCH AND METHOD OF FABRICATING THE SAME WITH LOW DEFECT DENSITY

CROSS REFERENCE TO RELATED APPLICATIONS

This application is a divisional of and claims the benefit of U.S. patent application Ser. No. 15/901,449, filed Feb. 21, 2018, issued as U.S. Pat. No. 10,879,106, which is incorporated herein by reference in its entirety.

BACKGROUND

Conductive deep trenches are deployed in high power semiconductor devices with multiple applications. In an integrated circuit die, conductive deep trenches may serve as isolation barriers that segregate high voltage components from low voltage components. In a discrete component, conductive deep trenches may serve as field plates and gate electrodes for high power transistors. Conductive deep trenches can be formed alongside with shallow trench isolations, such that one or more conductive deep trenches may overlap within a shallow trench isolation structure. However, the process for fabricating trenches with different depths can be complex and defect-prone.

SUMMARY

The present disclosure describes techniques for fabricating conductive deep trenches in conjunction with shallow trench isolations in a semiconductor device. The disclosed techniques introduce an integrated sequence during which a shallow trench is etched and filled before a deep trench is etched and filled. The disclosed techniques advantageously reduce cone defects along a top surface of the shallow trench isolation structures, thereby minimizing the defect density of a semiconductor device. And by integrating the deep trench formation process with the shallow trench formation process, the disclosed techniques advantageously reduce the process complexity of fabricating a semiconductor device.

In one implementation, for example, the present disclosure provides n integrated circuit that includes a semiconductor substrate that has a top surface. A trench is located within the substrate, and a conductive filler structure fills the trench. An insulator is located between the semiconductor substrate and the conductive filler. The insulator has a top portion with a top surface at the top surface of the substrate, The insulator further has a bottom portion that forms a corner with the top portion and extends from the corner to a bottom of the trench.

In another implementation, for example, the present disclosure provides a method of forming an integrated circuit. The method includes forming a shallow trench in a semiconductor substrate, and filling the shallow trench with an insulator. A deep trench is formed within the shallow trench. The deep trench has a sidewall of the insulator at an upper portion, and has a sidewall of the semiconductor substrate at lower portion. The deep trench may then be filled with a conductive material such as polysilicon.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Deep trench structures can be found in many semiconductor devices, such as high voltage analog devices. In high voltage applications, a deep trench structure may include a conductive filler, which can serve as a field plate for reducing electric field density, or as a gate electrode of a vertical transistor (e.g., a vertical diffused MOS (VDMOS) transistor). Deep trench structures can be formed in conjunction with shallow trench structures. As shown in FIGS. 1A-1G, for example, a semiconductor device 100 can be fabricated under a sequence that forms a deep trench 122 before forming a shallow trench 133.

Figure 1A:
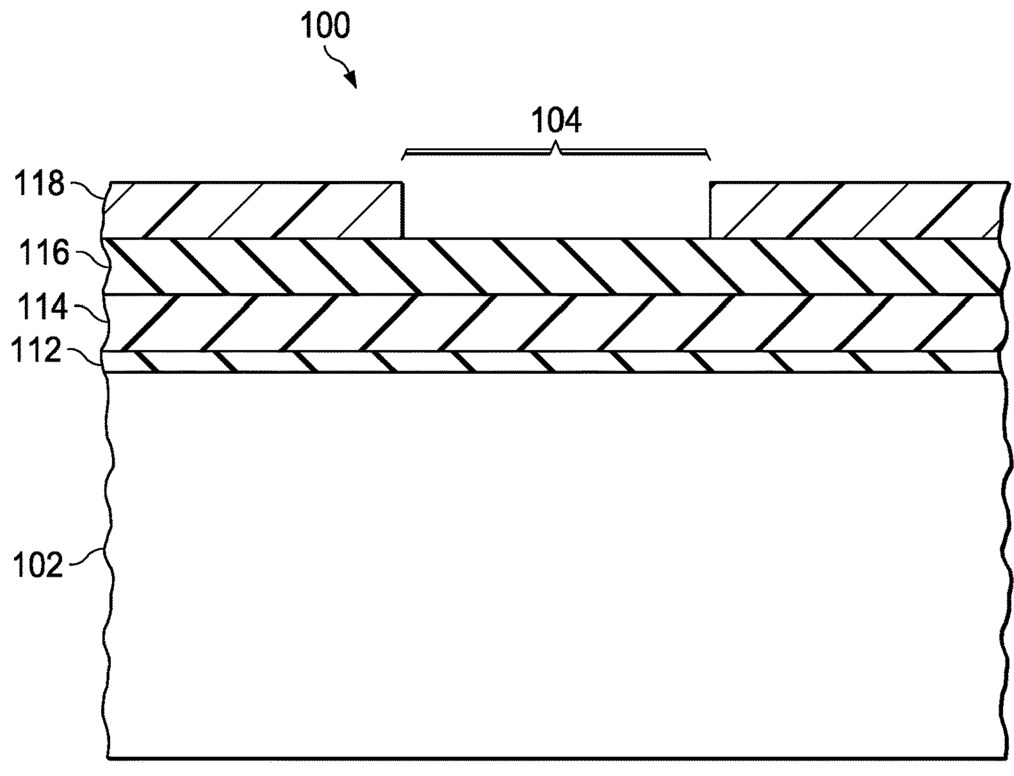
FIGS. 1A-1G show the partial cross-sectional views of a semiconductor device during a process for fabricating a deep trench followed by a shallow trench with cone defects.

Referring to FIG. 1A, the semiconductor device 100 can be a discrete component device (e.g., a single transistor device) or an integrated circuit having multiple transistor devices. At an early stage of the fabrication sequence, a pad oxide layer 112, a nitride cap layer 114, and a hard mask layer 116 are sequentially formed on a top surface of a semiconductor substrate 102. The pad oxide layer 112 servers the function of stress relief between the silicon and subsequent layers, and it may include silicon dioxide that is grown in a thermal oxidation process. The nitride cap layer 114 servers the function of exclusionary film allowing selective oxidation, and it may include silicon nitride (e.g., $Si_3N_4$) that is deposited under a Low Pressure Chemical Vapor Deposition (LPCVD) furnace process. The hard mask layer 116 servers the function of a hard mask during the subsequent Deep Trench etch process, and it may include silicon dioxide that is deposited under a Plasma Enhanced Chemical Vapor Deposition (PECVD) process.

Next, a photoresist mask 118 is deposited and patterned with an opening exposing a deep trench (DT) region 104 of the substrate 102. The photoresist mask 118 servers the function of masking the hard mask layer, and it may include a light sensitive organic material that is coated, exposed, and developed.

Figure 1B:
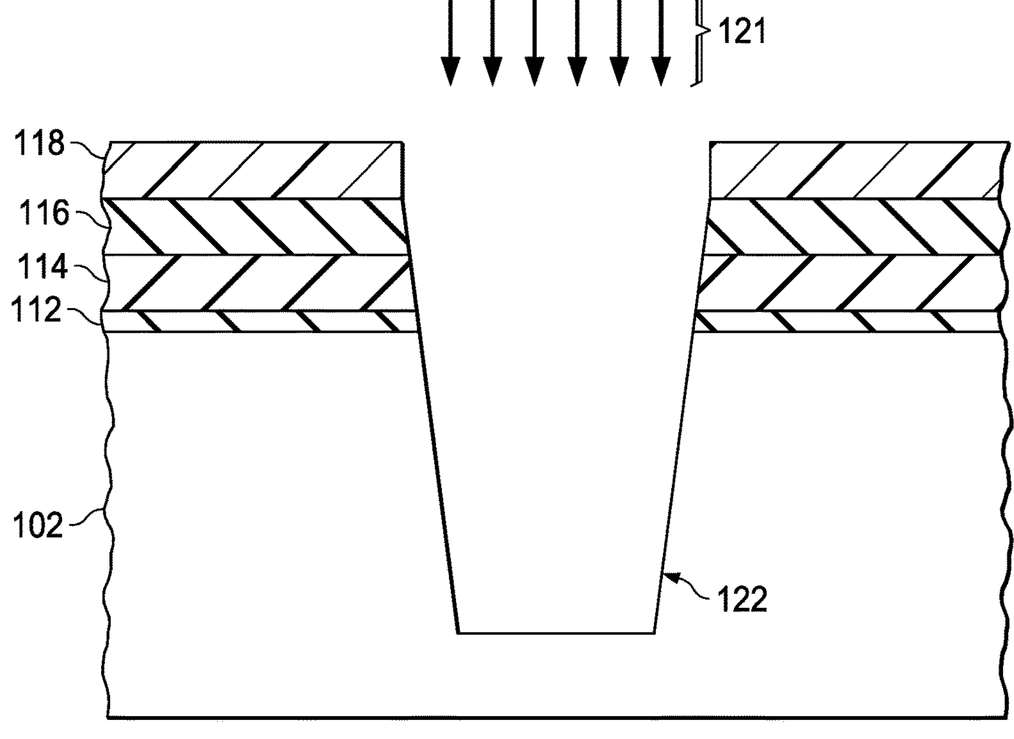

Referring to FIG. 1B, a DT etch process 121 is performed to form a deep trench 122. The DT etch process 121 may include multiple subsequences. In one implementation, for example, a hard mask etch may be first performed to remove the hard mask layer 116 exposed by the patterned photoresist mask 118, and a silicon etch may then be performed to remove the nitride cap layer 114, the pad oxide layer 112, and the substrate 102 that are exposed by the etched hard mask layer 116. During the silicon etch, the photoresist mask layer 118 is also removed, leaving the hard mask layer 116 to prevent the area outside of the DT region 104 from being etched.

Figures 1C, 1D:
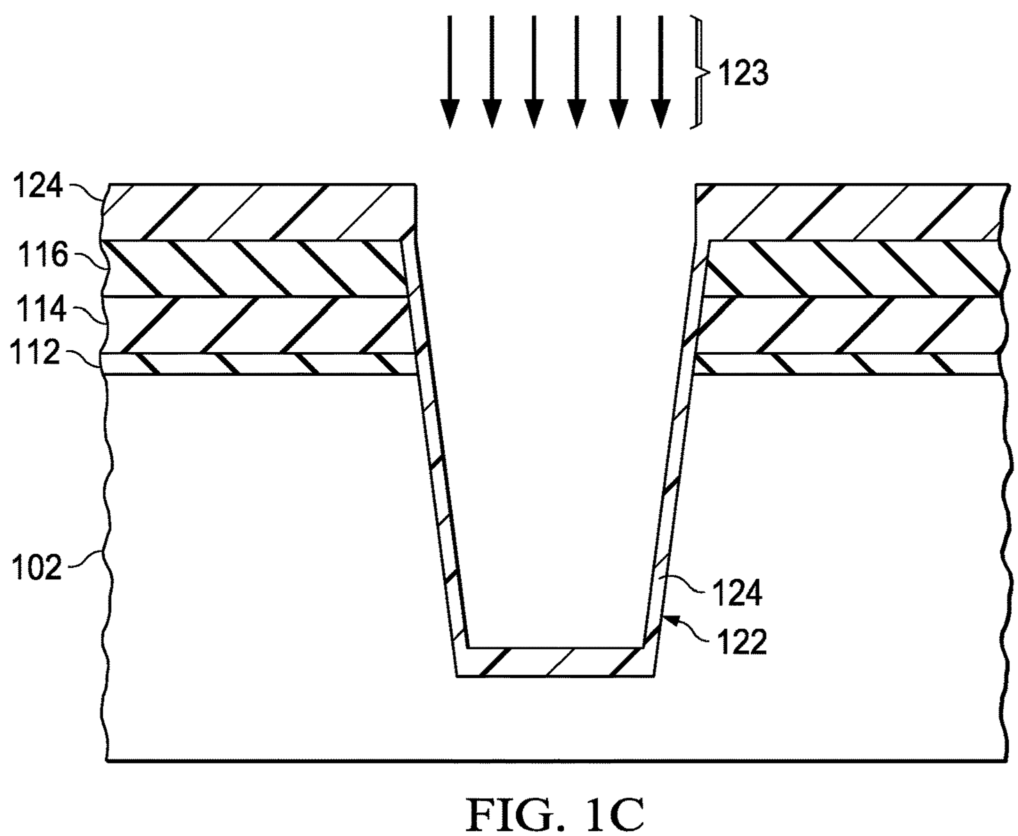

After the DT etch process 121, a dielectric liner deposition process is performed to cover the sidewalls of the deep trench 122. As shown in FIG. 1C, for example, a DT oxide liner 124 is deposited onto the sidewall of the deep trench 122 under a dielectric liner deposition process 123. In one implementation, the dielectric liner deposition 123 may include a sub-atmospheric chemical vapor deposition of an oxide target. The dielectric liner deposition process 123 may be followed by a deep trench dielectric etch process to achieve uniform liner thickness along the sidewall of the deep trench 122.

Referring to FIG. 1D, a polysilicon deposition process 125 is performed to fill the deep trench 122 with a conductive material. As a result, a DT filler structure 126 is formed in the deep trench 122. The DT filler structure 126 may contact the DT oxide liner 124. Alternatively, the DT filler structure 126 may directly contact the sidewall of the deep trench 122 where the DT oxide liner 124 is absent. During the polysilicon deposition process 125, a DT filler seam 127 may be formed along a vertical middle section of the FT filler structure 126. The dimensions of the DT filler seam 127 may depend on the aspect ratio of the deep trench 122.

After the DT filler structure 126 is formed, a chemical mechanical polish process is performed to remove excessive polysilicon material above the deep trench 122. At this point, a conductive deep trench 129 is formed. Then, the remaining nitride cap layer 114 and pad oxide layer 112 are removed and redeposited to complete the deep trench formation sequence and prepare for the shallow trench formation sequence.

Figures 1E, 1F:
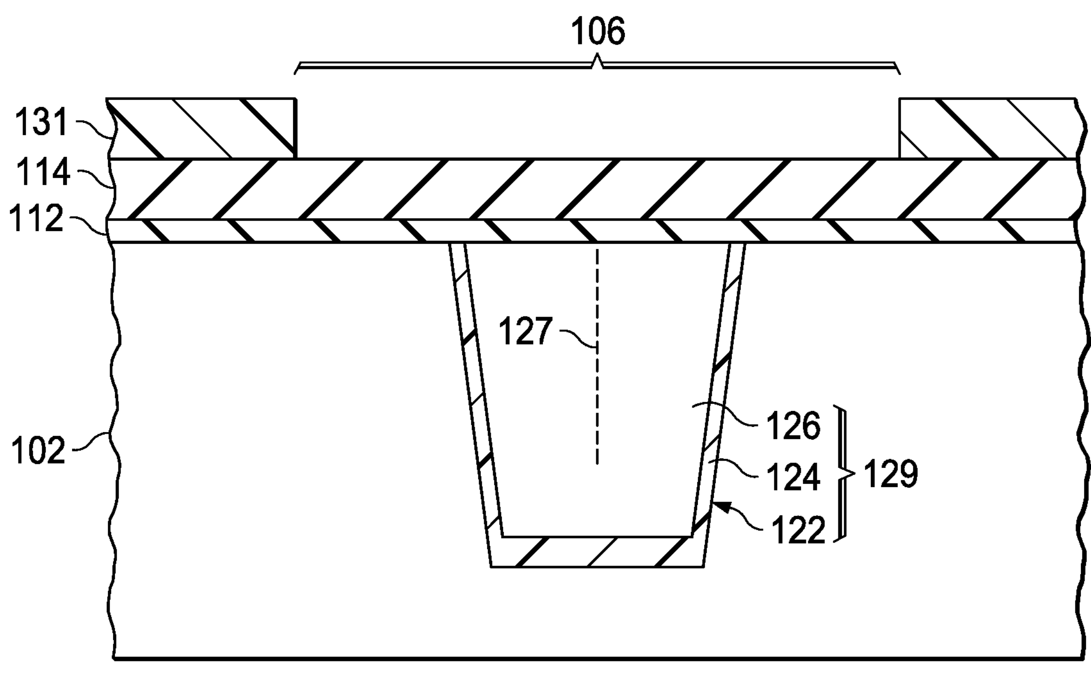

Referring to FIG. 1E, a photoresist mask 131 is deposited and patterned above the nitride cap layer 114 to expose a shallow trench (ST) region 106 of the semiconductor substrate 102. In general, the ST region 106 covers a wider area than the DT region 104, which may position completely within the ST region 106. After the photoresist mask 131 is patterned, a shallow trench etch process is performed. Referring to FIG. 1F, for example, a shallow trench etch process 132 may include a silicon etch to remove the nitride cap layer 114 and the pad oxide layer 112 exposed by the photoresist mask 131. During the silicon etch, the DT filler seam 127 may trap residuals from the nitride cap layer 114 and the pad oxide layer 112, which may in turn retard the etch rate around the DT filler seam 127. This slower etching may lead to the formation of one or more polysilicon cones 128 near the DT filler seam 127.

Figure 1G:
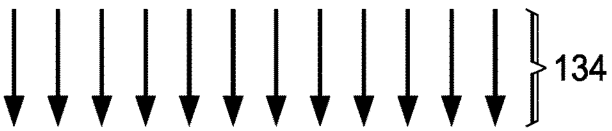
Figure 1G:
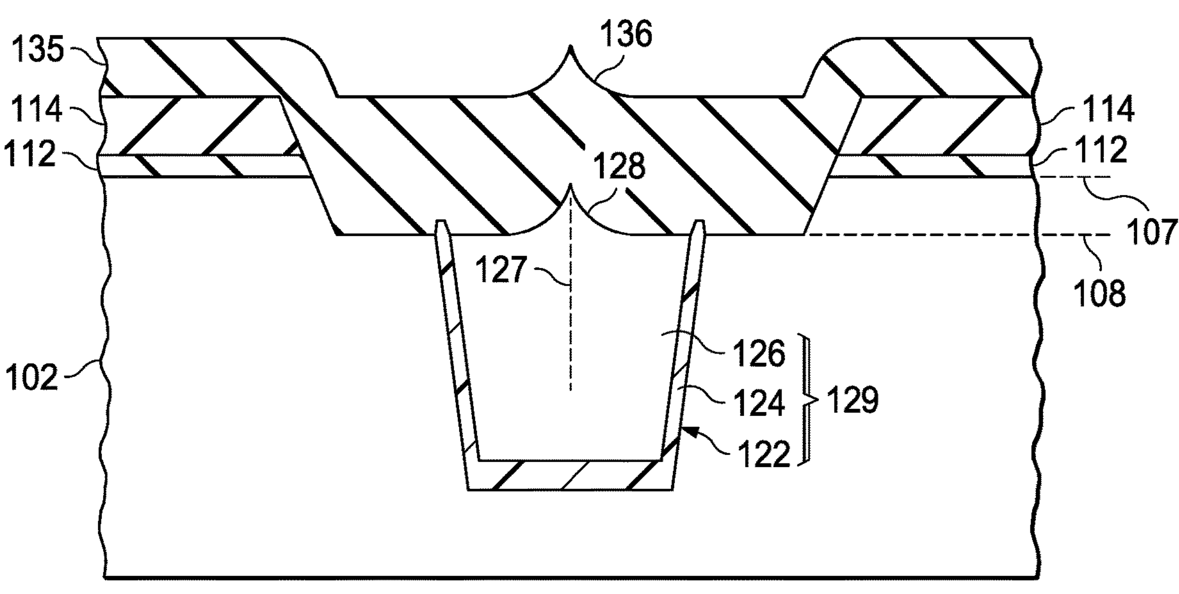

When the shallow trench etch 132 is completed, a shallow trench 133 is formed. And as a result of the shallow trench etch 132, the DT structure 129 recedes from a first plane 107, which aligns with the top surface of the substrate 102, to a second plane 108, which aligns with the bottom surface of the shallow trench 133. After the shallow trench 133 is formed, a dielectric liner may be deposited onto and aligns with the sidewall of the shallow trench 133. Then, as shown in FIG. 1G, a shallow trench fill process 134 is performed to fill the shallow trench 133 with a dielectric layer 135. The shallow trench fill process 134 may include a thermal oxide growth process or an oxide deposition process. Because of the polysilicon cone 128, the dielectric layer 135 may incur a dielectric cone 136 protruding from the top surface of the dielectric layer 135.

FIG. 1G only shows a single dielectric cone 136 and a single polysilicon cone 128, but in reality, a semiconductor device (e.g., device 100) fabricated under the process steps as shown above may incur many more dielectric cones and silicon cones in a small area. The dielectric cones may be subsequently removed during a chemical mechanical polish process. Nevertheless, the polysilicon cone 128 remains under the dielectric layer 135. As the dielectric layer 135 is mostly transparent, the polysilicon cone 128 is visible or detectable by one or more inspection devices. Thus, the polysilicon cone 128 may obstruct one or more inspection processes for detecting structural defects of the semiconductor device. As a result, yield related issues may remain undetected by the inspection processes. These undetected yield related issues will ultimately impact the yield of a mass production of the semiconductor devices.

Figures 2A, 2B:
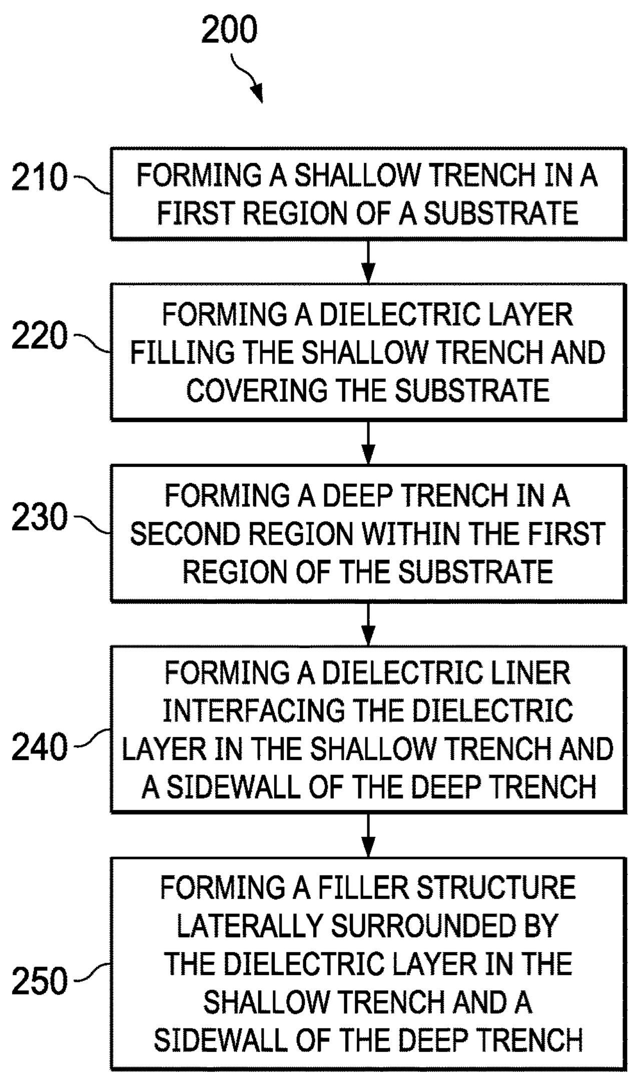
FIG. 2A shows a flow chart of an example method for fabricating a shallow trench followed by a deep trench free of cone defects according to an aspect of the present disclosure.
FIG. 2B shows a flow chart of an example method for forming a dielectric layer filling the shallow trench and covering the substrate according to an aspect of the present disclosure.

To reduce or eliminate inspection issues related to cone formation, the present disclosure introduces a method of fabricating a semiconductor device with overlapping shallow trench and deep trench structures that can prevent cone formation. According to an aspect of the present disclosure, FIG. 2A shows a flow chart of an example method 200 for fabricating a shallow trench followed by a deep trench free of cone defects. The method 200 begins at step 210, which involves forming a shallow trench in a first region of a substrate. Unlike the process as depicted in FIGS. 1A-1G, the method 200 arranges the shallow trench to be formed before the deep trench. For illustration, FIGS. 3A-3I show the partial cross-sectional views of an example semiconductor device 300 during a fabrication process that implements the method 200.

Figure 3A:
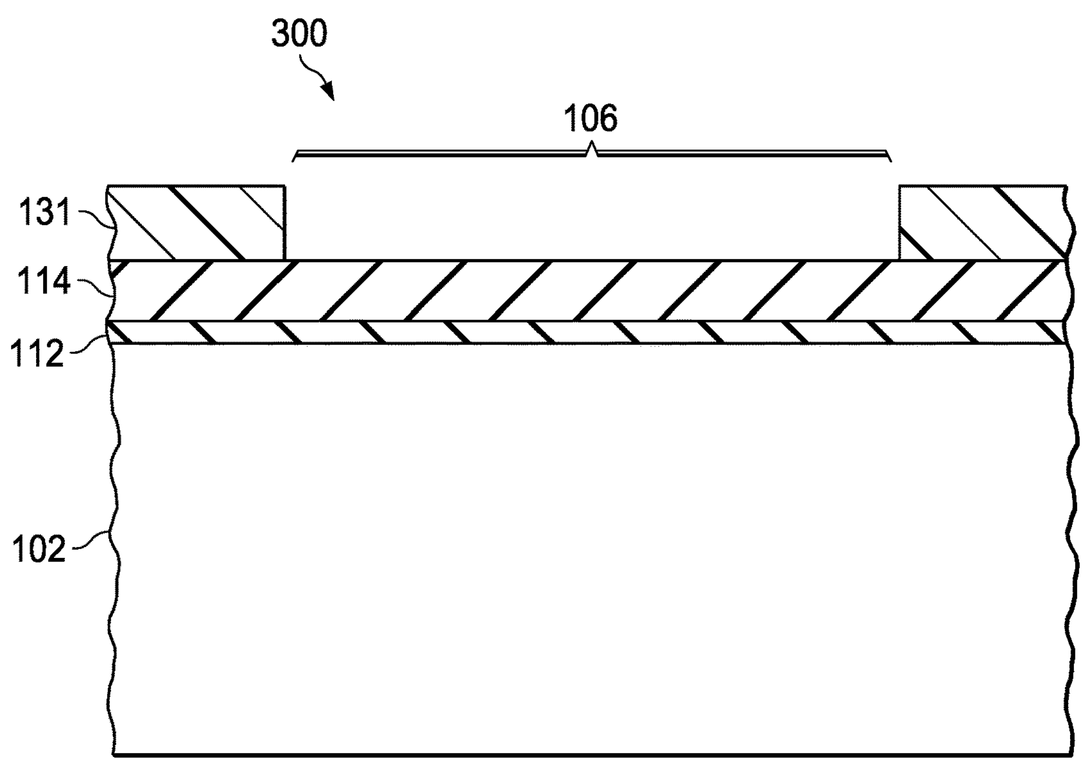
FIGS. 3A-3I show the partial cross-sectional views of an example semiconductor device during a fabrication process that implements the example method of FIGS. 2A and 2B according to an aspect of the present disclosure.

Referring to FIG. 3A, for example, the semiconductor device 300 is at an early stage of a fabrication process. The semiconductor device 300 can be a discrete component device (e.g., a single transistor device) or an integrated circuit having multiple transistor devices. Before step 210 is performed, a pad oxide layer 112, and a nitride cap layer 114 are sequentially formed on a top surface of a semiconductor substrate 102. The process parameters for forming the pad oxide layer 112, and the cap nitride layer 114 are essentially the same as described in association with FIG. 1A.

Figure 3B:
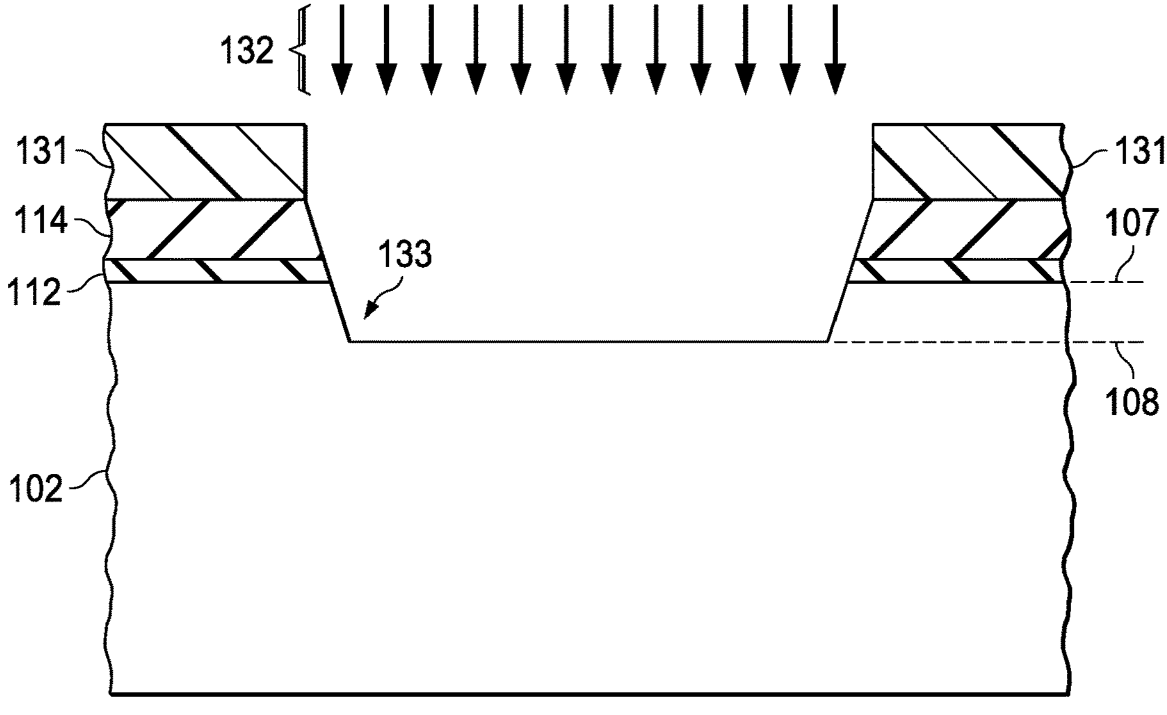

During step 210, a photoresist mask 131 is deposited and patterned with an opening exposing a shallow trench (ST) region 106 (e.g., first region) of the substrate 102. After the photoresist mask 131 is patterned, a shallow trench etch process is performed. Referring to FIG. 3B, for example, a shallow trench etch process 132 may include a silicon etch to remove the nitride cap layer 114, and the pad oxide layer 112 as exposed by the photoresist mask 131. When the shallow trench etch 132 is completed, a shallow trench 133 is formed.

Next, the method 200 proceeds to step 220, which involves forming a dielectric layer filling the shallow trench and covering the substrate. According to an aspect of the present disclosure, the dielectric layer has a substantially planar surface positioned over and extending across the shallow trench. The substantially planar surface advantageously allows the photoresist mask for etching a deep trench to be deposited and patterned more accurately. While step 220 can be performed by forming a single dielectric layer that fills the shallow trench (e.g., shallow trench 133), multiple dielectric layers may be formed during step 220 as well.

Figure 3C:
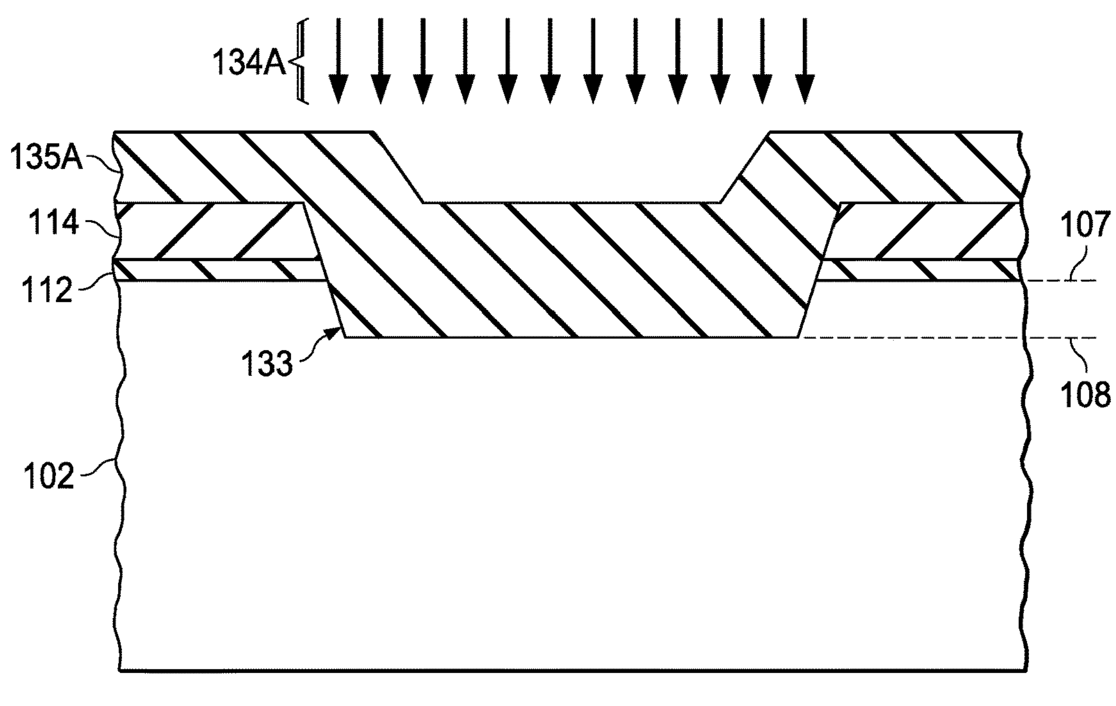

For example, FIG. 2B shows a method 220A for forming at least two dielectric layers that fills the shallow trench and covering the substrate. The method 220A begins at step 222, which involves forming a shallow trench oxide layer filling the shallow trench. The shallow trench oxide layer may be considered as a first oxide layer that fills the shallow trench, and it may be thermally grown onto the etched surface of the shallow trench. As shown in FIG. 3C, for example, a first dielectric formation process 134A is performed to formed a first dielectric layer 135A. The first dielectric formation process 134A may be a thermal oxidation process or an oxide deposition process (e.g., high density plasma deposition). The first dielectric layer 135A is a shallow trench oxide layer as it fills the entire shallow trench 133, which is positioned between a first plane 107 and a second plane 108 of the substrate 102. The first plane 107 aligns along a top surface of the substrate 102, whereas the second plane 108 aligns along a bottom surface of the shallow trench 133.

After forming the shallow trench oxide layer, the method 220A proceeds to step 224, which involves forming a hard mask layer covering the shallow trench oxide layer. The hard mask layer may be considered as a second oxide layer that covers the first oxide layer. In one implementation, the second oxide layer may have a lower oxide density than the first oxide layer. The cost of forming an oxide layer with a lower oxide density is lower than the cost of forming an oxide layer with a higher oxide density. Advantageously, the two-step approach provided by the method 220A helps reduce the cost of forming a dielectric layer that fills and covers the shallow trench as prescribed by step 220 in the method 200.

Figure 3D:
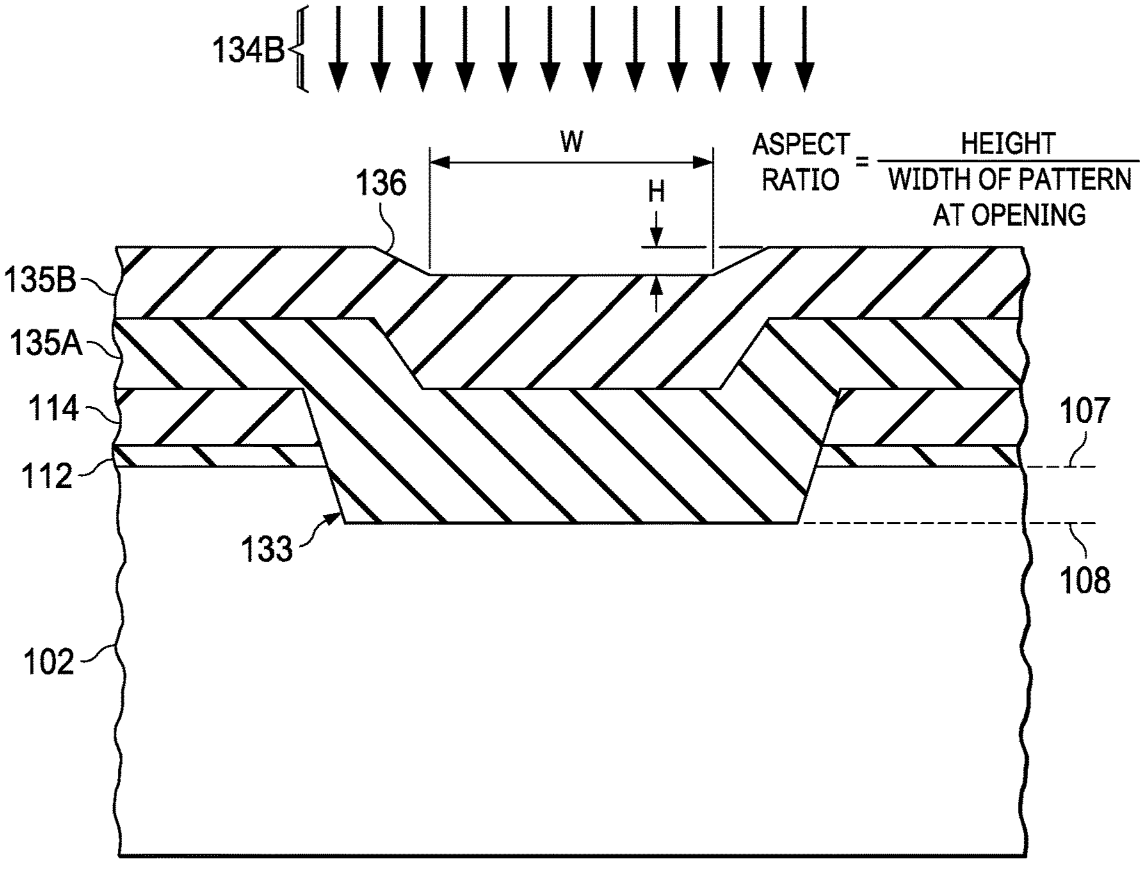

As shown in FIG. 3D, for example, a second dielectric formation process 134B is performed to formed a second dielectric layer 135B. The second dielectric formation process 134B may be a thermal oxidation process or an oxide deposition process (e.g., TEOS plasma enhanced chemical vapor deposition). The second dielectric layer 135B is a hard mask layer as it serves the function of a hard mask during a subsequent deep trench etching process. The second dielectric layer (or hard mask layer) 135B has a substantially planar surface 136. According to an aspect of the present disclosure, the surface of the second dielectric layer (or hard mask layer) 135B is substantially planar when it is sufficiently flat to allow accurate placement and patterning of a photoresist mask for the purpose of etching a deep trench within the shallow trench 133. In particular, the substantially planar surface 136 may have an aspect ratio defined by a height (H) of the surface over a width (W) that is sufficiently wide to serve as a deep trench aperture.

In one implementation, for example, the second dielectric layer (or hard mask layer) 135B has a substantially planar surface 136 where the aspect ratio is less than 0.4. In another implementation, for example, the second dielectric layer (or hard mask layer) 135B has a substantially planar surface 136 where the aspect ratio is less than 0.2. In yet another implementation, for example, the second dielectric layer (or hard mask layer) 135B has a substantially planar surface 136 where the aspect ratio is less than 0.1. The substantially planar surface 136 can be achieved by adjusting several process parameters for forming the first and/or second dielectric layers 135A and 135B. For example, the substantially planar surface 136 may be achieved where the second dielectric layer 135B has a thickness that is equal to or greater than that of the first dielectric layer 135A.

Figure 3E:
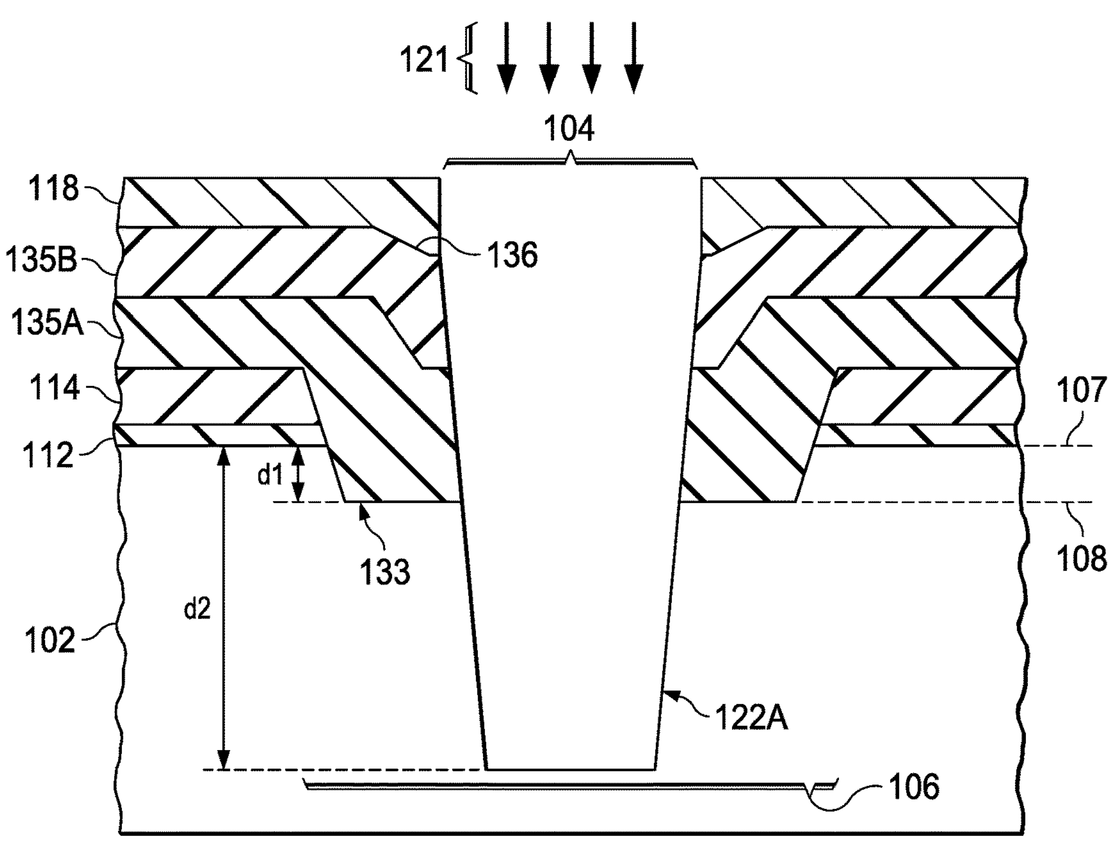

Referring again to FIG. 2A, the method 200 proceeds to step 230, which involves forming a deep trench in a second region within the first region of the substrate. As shown in FIG. 3E, for example, a deep trench (DT) etch process 121 is performed to form a deep trench 122A within a deep trench region 104, which can be a second region within the first region (e.g., 106) of the substrate 102. The DT etch process 121 may include multiple subsequences. In one implementation, for example, a hard mask etch may be first performed to remove the second and first dielectric layer 135B and 135A as exposed by the patterned photoresist mask 118, and a silicon etch may then be performed to remove the substrate 102 that is exposed by the second dielectric layer 135B, which serves as a hard mask layer. During the silicon etch, the photoresist mask layer 118 is also removed, leaving the second dielectric layer (or hard mask layer) 135B to prevent the area outside of the DT region 104 from being etched.

As a result of the DT etch process 121, the deep trench 122A extends from and penetrating through the second and first dielectric layers 135B and 135A. The deep trench 122A has a trench depth d2 that is greater than a trench depth d1 of the shallow trench 133, whereas the shallow trench 133 has a trench aperture (e.g., less than the width of the ST region 106) that is wider than a trench aperture (e.g., less than the width of the DT region 104) of the deep trench 122A.

According to an aspect of the present disclosure, the DT etch process 121 is integrated with the shallow trench isolation process (e.g., steps 210-220; FIGS. 3A-3D). The disclosed integration provides multiple advantages from a process standpoint. First, the disclosed integration reduces the total number of process steps for fabricating a deep trench structure within a shallow trench structure. For instance, the re-depositions of the pad oxide layer 112 and the cap nitride layer 114 (see, e.g., FIGS. 1D-1E) can be eliminated. This is because the shallow trench dielectric layer (e.g., 135A and 135B) may serve the functions of the pad oxide and cap nitride layers 112 and 114 during the DT etch process 121.

Second, the sequence of forming a deep trench after a shallow trench also helps prevent cone formation. As shown in subsequent figures, this is because the deep trench filler structure 126A is no longer etched and then covered by the shallow trench dielectric layer (e.g., 135A and 135B), which reduces the chances that the etch contaminants to be trapped and built up within the DT filler seam 127A of the DT structure 129A.

Third, the disclosed integration process overcomes a phenomenon known as deep trench pattern distortion due to photoresist thickness variation over the shallow trench dielectric layer (e.g., 135A and 135B). By forming the photoresist mask 118 over a substantially planar surface 136 of the second dielectric layer (or hard mask layer) 135B, the deep trench pattern size (e.g., opening exposing the DT region 106) can be critically controlled to achieve deep trench etch depth uniformity.

Figure 3F:
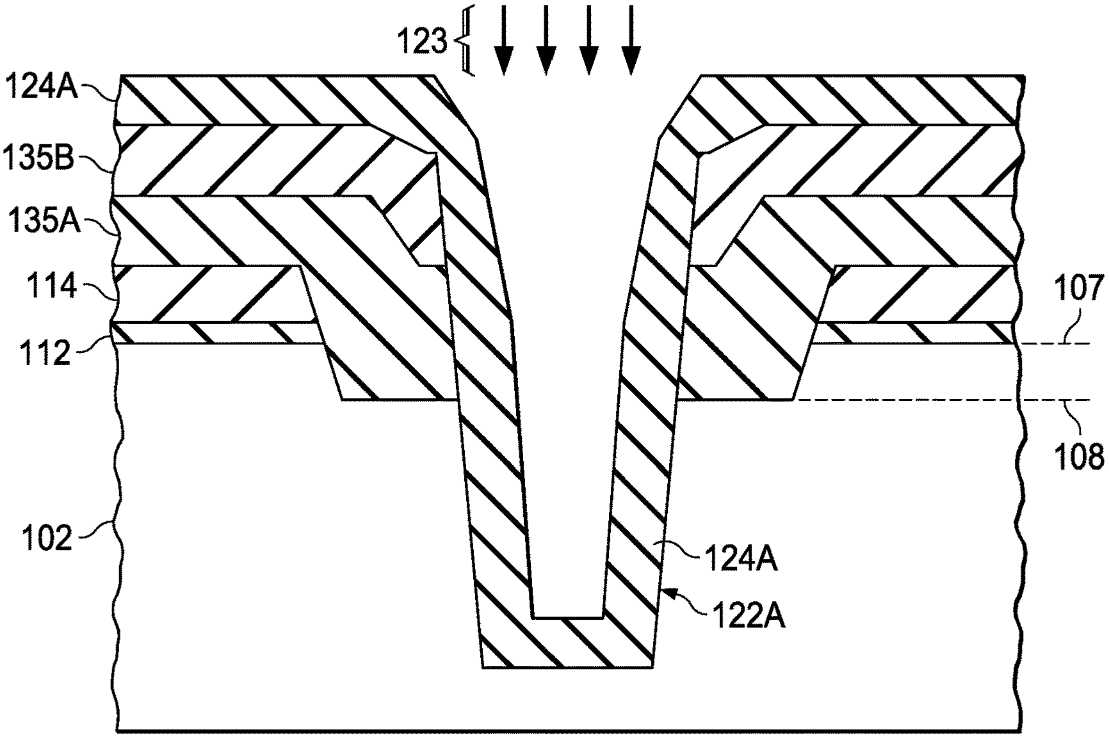

After forming the deep trench, the method 200 proceeds to step 240, which involves forming a dielectric liner interfacing the dielectric layer in the shallow trench and a sidewall of the deep trench. As shown in FIG. 3F, for example, a DT oxide liner 124A is deposited onto the etched sidewalls of the dielectric layers 135A and 135B and onto the sidewall of the deep trench 122A under a dielectric liner deposition process 123. In one implementation, the dielectric liner deposition 123 may include a sub-atmospheric chemical vapor deposition of an oxide target.

Unlike the DT oxide liner 124 as shown in FIGS. 1E and 1F, which is positioned under the shallow trench 133, the DT oxide liner 124A extends upward to interface the first and second dielectric layers 135A and 135B within and over the shallow trench 133. The dielectric liner deposition process 123A may be followed by a deep trench dielectric etch process to achieve uniform liner thickness along the sidewall of the deep trench 122A.

Figure 3G:
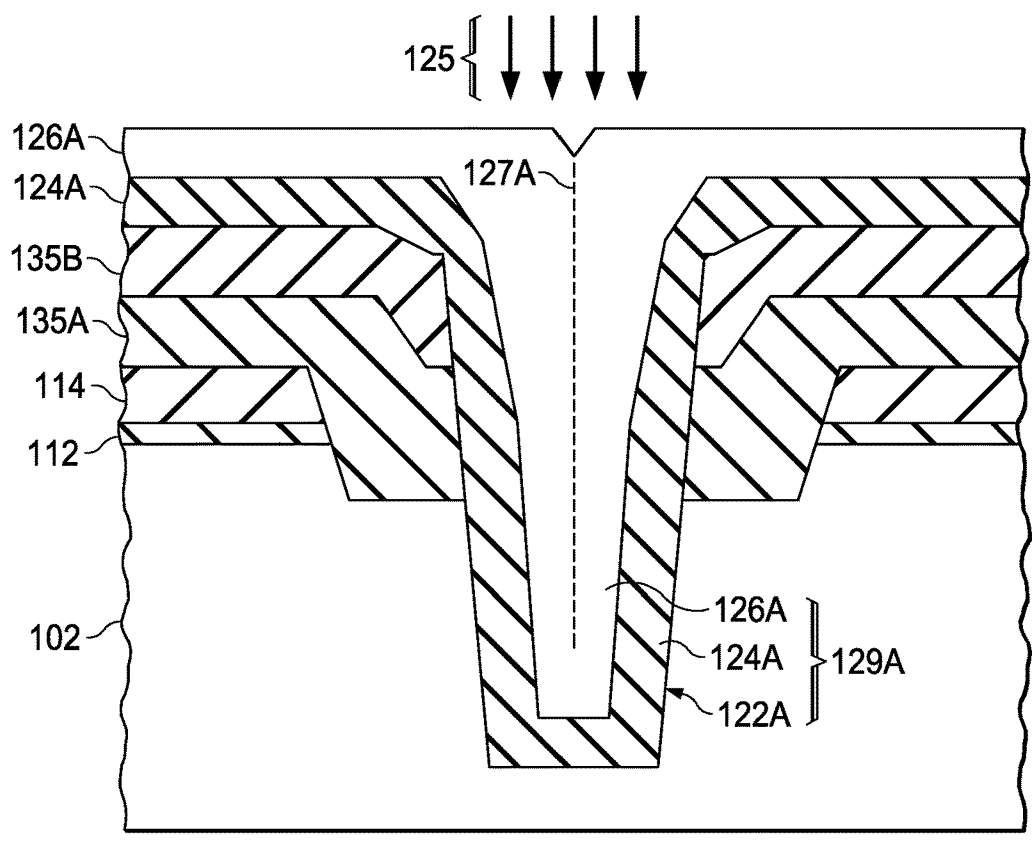

After the formation of the dielectric liner, the method 200 proceeds to step 250, which involves forming a filler structure laterally surrounded by the dielectric layer in the shallow trench and a sidewall of the deep trench. As shown in FIG. 3G, for example, a polysilicon deposition process 125 is performed to fill the deep trench 122A with a conductive material. As a result, a DT filler structure 126A is formed in the deep trench 122A. The DT filler structure 126A may contact the DT oxide liner 124A and be laterally surrounded by the dielectric layers 134A and 135B. During the polysilicon deposition process 125, a DT filler seam 127A may be formed along a vertical middle section of the FT filler structure 126A. The dimensions of the DT filler seam 127A may depend on the aspect ratio of the deep trench 122A. Unlike the DT filler seam 127 as shown and described in FIGS. 1F-1G, the DT filler seam 127A will not be subjected to further etching. As such, the DT filler seam 127A is unlikely to contribute to subsequent cone formations as shown and described in FIG. 1G.

Figure 3H:
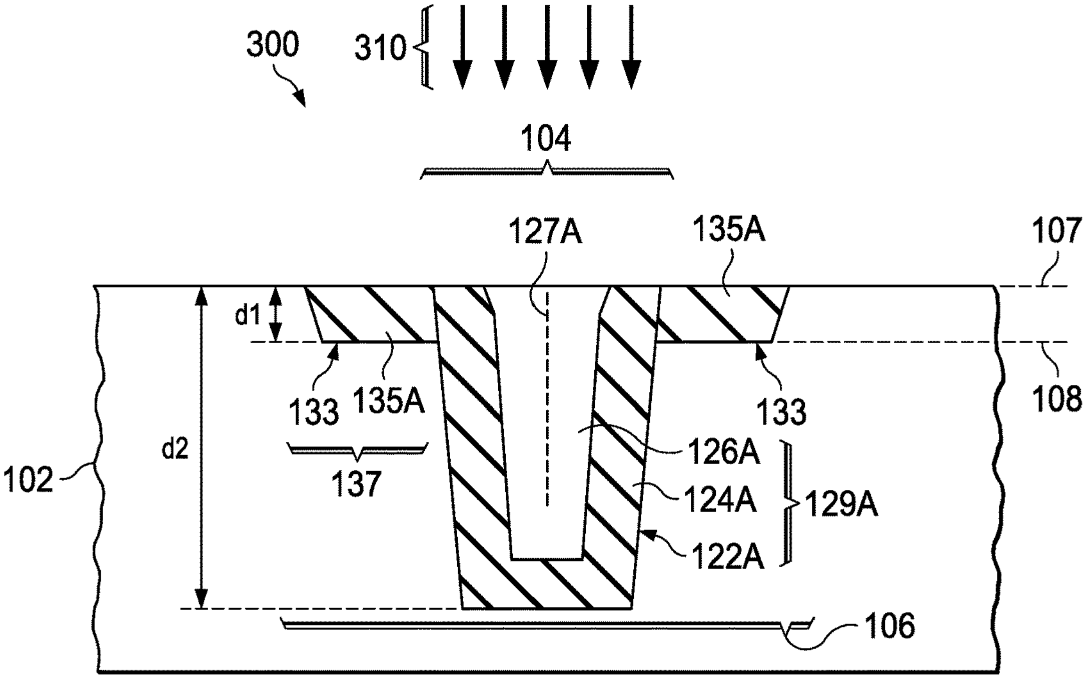

After the DT filler structure 126 is formed, a chemical mechanical polish process is performed to remove excessive polysilicon material above the deep trench 122. Referring to FIG. 3H, for example, a chemical mechanical polish process 310 is performed to remove the remaining nitride cap layer 114 and pad oxide layer 112. After the chemical mechanical polish process 310, the semiconductor device 300 includes a deep trench structure 129A extending downward and within a shallow trench structure 137. The shallow trench structure 137 includes a shallow trench dielectric layer 135A that extends from a first plane 107 that aligns with a top surface of the substrate 102. The shallow trench structure 137 further extends into the substrate 102 by a first depth d1. The deep trench structure 129A extends from the first plane 107 that aligns with a top surface of the substrate 102. The deep trench structure 129 penetrates through the shallow trench dielectric layer 135A and a second plane 108 that aligns with the bottom surface of the shallow trench 133. The deep trench structure 129 further extends into the substrate 102 by a second depth d2, which is greater than the first depth d1.

The DT filler structure 126A of the deep trench structure 129A includes a polysilicon plate having an upper portion and a lower portion. The upper portion has a first width, and it is positioned within in the shallow trench 133. The lower portion has a second width, and it is positioned within in the deep trench 122A. In one implementation, the first width is greater than the second width. The DT oxide liner 124A interfaces between the upper portion of the polysilicon plate and the shallow trench dielectric layer 135A. Moreover, the DT oxide liner 124A also interfaces between the lower portion of the polysilicon plate and the substrate 102. In one implementation, the DT oxide liner 124A has a lower oxide density than the shallow trench dielectric layer 135A.

Figure 3I:
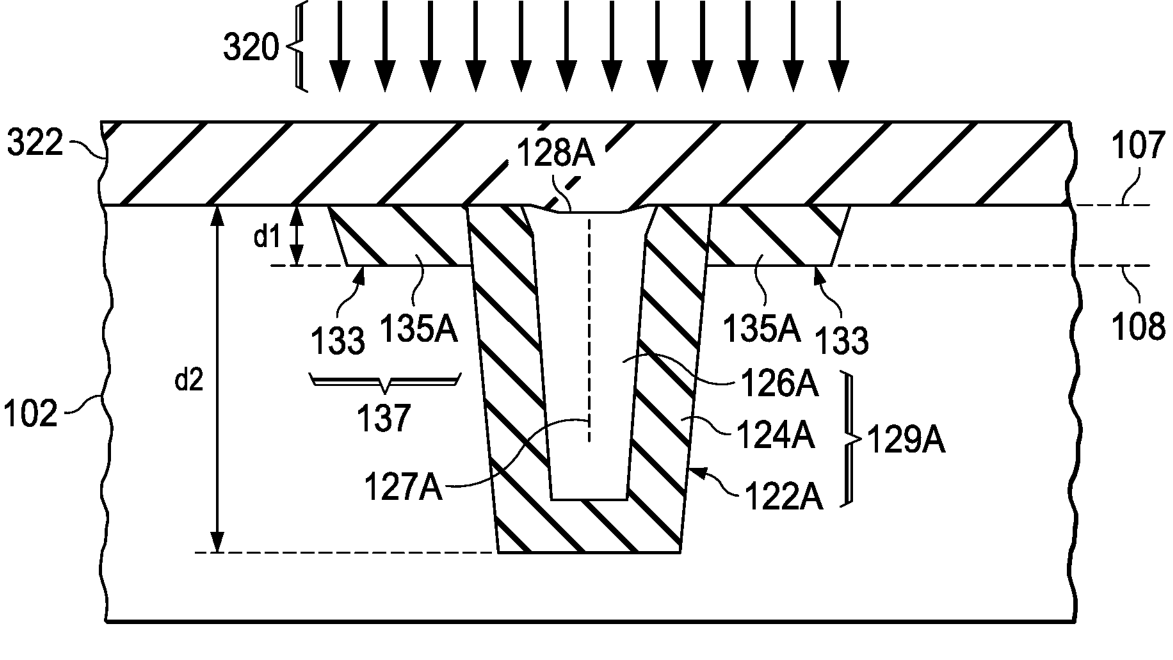

At this stage of the fabrication process (see, e.g., FIG. 3H), the semiconductor device 300 is substantially cone free around the top surface of the deep trench structure 129 as well as the shallow trench structure 137. The semiconductor device 300 can be prepared for further processing, which may include the formation of one or more dielectric layers above the deep trench structure 129 as well as the shallow trench structure 137. Referring to FIG. 3I, for example, a dielectric deposition process 320 may be performed to form a dielectric layer 322 that covers a DT top surface 128A as well as a top surface of the substrate 102 and the shallow trench structure 137. In the event that the DT filler structure 126A is not further etched, any subsequent deposition of dielectric layer is unlikely to cause any cone formation thereon.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

Furthermore, terms of relativity, such as "about," "approximately," "substantially," "near," "within a proximity," "sufficient . . . to," "maximum," and "minimum," as applied to features of an integrated circuit and/or a semiconductor device can be understood with respect to the fabrication tolerances of a particular process for fabricating the integrated circuit and/or the semiconductor device. In addition, these terms of relativity can be understood within a framework for performing one or more functions by the integrated circuit and/or the semiconductor device.

More specifically, for example, the terms "substantially the same," "substantially equals," and "approximately the same" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A method of forming an integrated circuit, comprising:
forming a shallow trench in a semiconductor substrate;
filling the shallow trench with an insulator;
forming a deep trench within the shallow trench, the deep trench having a sidewall of the insulator at an upper portion, and having a sidewall of the semiconductor substrate at a lower portion; and
forming a dielectric liner that touches the insulator and the semiconductor substrate within the deep trench.

2. The method of claim 1, further comprising filling the deep trench with a conductive material over the dielectric liner.

3. The method of claim 2, wherein the conductive material comprises polysilicon.

4. The method of claim 2, wherein the conductive material includes a seam within the deep trench.

5. The method of claim 2, further comprising removing the insulator, the dielectric liner and the conductive material above a top surface of the semiconductor substrate.

6. The method of claim 2, wherein the dielectric liner has a lower density than the insulator.

7. The method of claim 2, wherein the insulator is formed by thermal oxidation.

8. The method of claim 2, wherein the insulator is formed by a first dielectric layer formed by thermal oxidation and a second dielectric layer formed by a plasma deposition process.

9. The method of claim 2, wherein the insulator includes a first dielectric layer formed by a first plasma oxide deposition process and a second dielectric layer formed by a second plasma oxide deposition process.

10. The method of claim 9, wherein the first plasma oxide deposition process is a high density plasma oxide deposition process and the second plasma oxide deposition process is a TEOS oxide chemical vapor deposition process.

11. A method of forming an integrated circuit, comprising:
forming a shallow trench in a semiconductor substrate;
forming a first dielectric layer within the shallow trench, the first dielectric layer having a surface that forms a recess having a width and a height over the shallow trench; and
forming a second dielectric layer over the first dielectric layer within the recess; and
forming a deep trench within the shallow trench, the deep trench having a sidewall that includes sidewalls of the first and second dielectric layers at an upper portion, and including a sidewall of the semiconductor substrate at a lower portion.

12. The method of claim 11, further comprising forming a dielectric liner that touches the sidewalls of the first and second dielectric layers and the sidewall of the semiconductor substrate within the deep trench.

13. The method of claim 12, further comprising filling the deep trench with a conductive material over the dielectric liner.

14. The method of claim 13, wherein the conductive material comprises polysilicon.

15. The method of claim 13, wherein the conductive material includes a seam within the deep trench.

16. The method of claim 13, further comprising removing the first and second dielectric layers, the dielectric liner and the conductive material above a top surface of the semiconductor substrate.

17. The method of claim 12, wherein the dielectric liner has a lower density than the first dielectric layer.

18. The method of claim 11, wherein the first dielectric layer is formed by thermal oxidation and the second dielectric layer formed by a plasma deposition process.

19. The method of claim 11, the first dielectric layer is formed by a high density plasma deposition process and the second dielectric layer formed by a TEOS plasma deposition chemical vapor deposition process.

20. A method of forming an integrated circuit, comprising:
forming a first trench having a first depth within a semiconductor layer, the first trench having a first sidewall and an opposing second sidewall;
filling the first trench with an insulator;
forming a second trench between the first and second sidewalls, the second trench having a second depth greater than the first depth, and having a third sidewall that includes a sidewall of the insulator at an upper portion of the third sidewall and a sidewall of the semiconductor layer at lower portion of the third sidewall; and
forming a dielectric liner that touches the upper portion of the third sidewall and the lower portion of the third sidewall.

* * * * *